United States Patent
Zhao et al.

(10) Patent No.: US 11,805,372 B2
(45) Date of Patent: Oct. 31, 2023

(54) MEMS CHIP

(71) Applicant: AAC ACOUSTIC TECHNOLOGIES (SHENZHEN) CO., LTD., Shenzhen (CN)

(72) Inventors: Zhuanzhuan Zhao, Shenzhen (CN); Linlin Wang, Shenzhen (CN); Rui Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 87 days.

(21) Appl. No.: 17/562,011

(22) Filed: Dec. 27, 2021

(65) Prior Publication Data

US 2023/0164494 A1    May 25, 2023

(30) Foreign Application Priority Data

Nov. 24, 2021 (CN) .......................... 202122910629.8

(51) Int. Cl.
| | |
|---|---|
| *H04R 19/04* | (2006.01) |
| *B81B 3/00* | (2006.01) |
| *H04R 7/04* | (2006.01) |
| *H04R 7/08* | (2006.01) |
| *H04R 7/18* | (2006.01) |

(52) U.S. Cl.
CPC ............ *H04R 19/04* (2013.01); *B81B 3/0021* (2013.01); *H04R 7/04* (2013.01); *H04R 7/18* (2013.01); *B81B 2201/0257* (2013.01); *B81B 2203/0127* (2013.01); *B81B 2203/0315* (2013.01); *B81B 2203/0353* (2013.01); *H04R 2201/003* (2013.01)

(58) Field of Classification Search
CPC .... H04R 19/04; H04R 2201/003; H04R 7/04; H04R 7/18; B81B 2201/02; B81B 2203/01
See application file for complete search history.

(56) References Cited

U.S. PATENT DOCUMENTS 9,118,994 B2 * 8/2015 Uchida .................... H04R 7/06
2010/0284553 A1 * 11/2010 Conti .................. B81C 1/00158
 381/174

* cited by examiner

*Primary Examiner* — Sunita Joshi
(74) *Attorney, Agent, or Firm* — W&G Law Group

(57) ABSTRACT

The present disclosure discloses a MEMS chip including a capacitance system and a substrate with a back cavity. The capacitance system includes a back plate and a membrane; the substrate is located on one side of the membrane away from the back plate, including a first surface opposite to the membrane, a second surface opposite to the first surface, and an inner wall connecting the first surface and the second surface and enclosing the back cavity; the inner wall includes a first opening close to the membrane, having a first width along a first direction perpendicular with a vibration direction of the membrane, and a second opening away from the membrane, having a second width smaller than the first width along the first direction. The resonance frequency of the MEMS chip has been effectively improved and the SNR is simultaneously high.

4 Claims, 1 Drawing Sheet

MEMS CHIP

FIELD OF THE PRESENT DISCLOSURE

The present disclosure relates to micro-electromechanical systems, especially relates to a MEMS chip applied in mobile device.

DESCRIPTION OF RELATED ART

Micro-Electro-Mechanical System (MEMS) chips are widely applied in acoustic components, such as MEMS condenser microphone. In related art, the MEMS chip is sealed in a shell with an accommodation space. The MEMS chip includes a substrate with a back cavity and a capacitance system disposed on the substrate. The capacitance system includes a membrane and a back plate arranged at an interval. A sound hole is provided on the shell communicating the back cavity, thus allowing the membrane to move under external pressure wave.

Generally speaking, the high the resonance frequency of the membrane, the better the sensitivity of the MEMS chip. But, once the package structure is defined, the sound hole and the volume of the accommodation space are unchangeable. The resonance frequency of the membrane can only be improved by adjusting the membrane stiffness and the acoustic compliance of the back cavity. However, firstly, the sensitivity and signal noise ratio (SNR) of the MEMS chip would reduce with the increase of the membrane stiffness; secondly, volume decrease of the back cavity in a traditional way may increase the overlapped area between the membrane and the substrate, thus resulting in more noise and lower SNR.

Therefore, it is necessary to provide an improved MEMS chip to overcome the problems mentioned above.

SUMMARY OF THE INVENTION

The present disclosure provides a MEMS chip with higher resonance frequency and higher SNR.

The MEMS chip includes a capacitance system and a substrate with a back cavity, supporting the capacitance system above the back cavity. The capacitance system includes a back plate and a membrane spaced apart from and opposite to the back plate; the substrate is located on one side of the membrane away from the back plate, including a first surface opposite to the membrane, a second surface opposite to the first surface, and an inner wall connecting the first surface and the second surface and enclosing the back cavity; the inner wall includes a first opening close to the membrane, having a first width along a first direction perpendicular with a vibration direction of the membrane, and a second opening away from the membrane, having a second width smaller than the first width along the first direction.

Further, a projection of the inner wall along the vibration direction is trapezoid.

Further, the MEMS chip comprises a first support portion fixed on the substrate; the membrane is fixed on one side of the first support portion away from the substrate.

Further, the MEMS chip comprises a second support portion fixed on one side of the membrane away from the first support portion; the back plate is positioned above the membrane by support of the second support portion.

Further, a plurality of through holes is provided on the back plate; the through holes penetrate the back plate along the vibration direction of the membrane.

Further, the back plate comprises a lower surface facing the membrane and a protrusion protruding from the lower surface towards the membrane; the protrusion is spaced apart from the membrane along the vibration direction of the membrane.

BRIEF DESCRIPTION OF THE DRAWINGS

The present disclosure will hereinafter be described in detail with reference to an exemplary embodiment. To make the technical problems to be solved, technical solutions and beneficial effects of present disclosure more apparent, the present disclosure is described in further detail together with the figures and the embodiment. It should be understood the specific embodiment described hereby is only to explain this disclosure, not intended to limit this disclosure.

DETAILED DESCRIPTION OF THE EXEMPLARY EMBODIMENTS

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

It should be noted that the description of "first", "second" and the like in the present disclosure is only used for description purposes, and cannot be understood as indicating or implying its relative importance or implying the number of indicated technical features. Thus, a feature defined as "first" or "second" may include at least one such feature, either explicitly or implicitly. In addition, the technical solutions among the various embodiments can be combined with each other, but it must be based on that it can be realized by ordinary technicians. When the combination of the technical solutions is contradictory or cannot be realized, it should be considered that the combination of the technical solutions does not exist, nor is it within the scope of protection required by the present disclosure.

Figure 1:
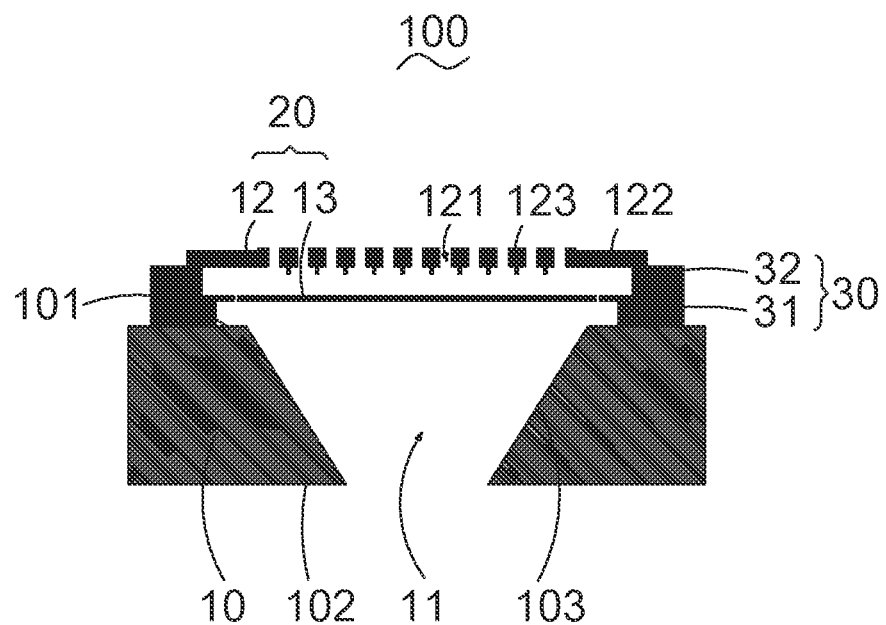
FIG. 1 is a cross-sectional view of a MEMS chip in accordance with an exemplary embodiment of the present disclosure.
Figure 2:
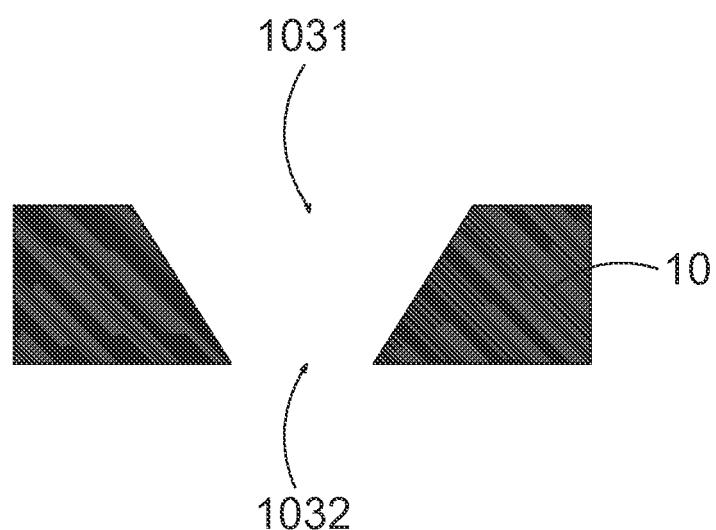
FIG. 2 is a cross-sectional view of a substrate of the MEMS chip in FIG. 1.

Please refer to FIGS. 1-2 together, a MEMS chip 100 provided by an exemplary embodiment of the present disclosure includes a substrate 10 with a back cavity 11 and a capacitance system 20 disposed on the substrate 10. Specifically, the capacitance system 20 includes a back plate 12 and a membrane 13. The back plate 12 and the membrane are arranged at an interval for providing vibration space for the membrane 13. The capacitance value of the capacitance system 20 varies with the distance between the back plate 12 and the membrane 13 when the membrane 13 vibrates under acoustic wave, therefore achieving acoustoelectric conversion.

It can be understood that the back cavity 11 penetrates the substrate 10 along a vibration direction of the membrane 13. The substrate 10 supports the capacitance system 20 over the back cavity 11. In this embodiment, the back plate 12 is located on one side of the membrane 12 away from the substrate 10.

Furthermore, the substrate 10 includes a first surface 101 facing the membrane 13, a second surface 102 opposite to the first surface 101, and an inner wall 103 connecting the first surface 101 and the second surface 102. The inner wall 103 encloses the back cavity 11 of the substrate 10.

The MEMS chip 100 further includes a support structure 30 fixed on the substrate 10 to support the capacitance system 20 being above the back cavity 11. Further, the support structure 30 includes a first support portion 31 fixed on the substrate 10 and a second support structure 32. Specifically, the first support structure 31 is fixed on the first surface 101; the membrane 13 is fixed on one side of the first support structure 31 away from the substrate 10. In this way, the membrane 13 is above the back cavity 13 so as to induce the acoustic wave directly. In addition, the second support portion 32 is fixed on one side of the membrane 13 away from the first support portion 31. The second support portion 32 supports the back plate 12 to be above the membrane 13. In another word, the second support portion 32 is positioned between the membrane 13 and the back plate 12. It can be understood that the first support portion 31 is fixed on the periphery of the membrane 13. Similarly, the second support portion 32 is fixed on the periphery of the back plate 12.

In this embodiment, the inner wall 103 includes a first opening 1031 close to the membrane 13 and a second opening 1032 away from the membrane 13. It can be understood that the first opening 1031 and the second opening 1032 are located on two opposite ends of the substrate 10 along the vibration direction. And, the first opening 1031 faces the membrane 13 along the vibration direction. As a result, the first opening 1031 is closer to the membrane 13 than the second opening 1032. Further, along a direction perpendicular with the vibration direction of the membrane 13, a width of the second opening 1032 is smaller than a width of the first opening 1031. In related art, even if the volume of the back cavity is decreased, a width along the vibration direction of back cavity of the substrate is consistent. Thus, the overlapped area of the membrane and the substrate along the vibration direction may be increased, resulting in extra acoustic noise and decreasing the SNR of the MEMS chip. One aspect of this embodiment, the volume of the back cavity 11 reduces with the decrease of the width of the second opening 1032. In this manner, the resonance frequency of the MEMS chip 100 is effectively improved. Another aspect of this embodiment, compared with the related art, the width of the first opening 1031 maintains; so the overlapped area of the membrane 13 and the substrate 10 would not increase, thus avoiding the extra acoustic noise and retaining high SNR. Therefore, the width difference of first opening 1031 and the second opening 1032 can achieve dual advantageous effects and further optimizes the acoustic ability of the MEMS chip 100.

In this embodiment, a width of the inner wall 1032 along the direction perpendicular with the vibration direction gradually increases from the first opening 1031 to the second opening 1032. Considering the preparation feasibility, a projection of the inner wall 1032 along the vibration direction is trapezoid. In other embodiments, the projection can be other shape such as arc shape and staircase shape, only if the width difference between the first opening 1031 and the second opening 1032 remains.

In addition, a plurality of through holes 121 is provided on the back plate 12. The through holes 121 penetrate the back plate 12 along the vibration direction. Further, the back plate 12 includes a lower surface 122 facing the membrane 13 and a protrusion 123 protruding from the lower surface 122 towards the membrane 13. The protrusion 123 is spaced apart from the membrane 13. When the membrane 13 vibrates, the protrusion 123 can avoid the adhesion between the back plate 12 and the membrane 13.

Compared with the related art, in the embodiment of the present disclosure, the MEMS chip includes a substrate having a first surface, a second surface and an inner wall connecting the first surface and the second surface. The inner wall encloses a back cavity of the substrate. The inner wall includes a first opening facing the membrane and a second opening away from the membrane. Along a direction perpendicular with to the vibration direction, a width of the second opening is smaller than a width of the first opening. The volume of the back cavity decreases, further avoiding the increase of the overlapped area of the membrane and the substrate along the vibration direction. Thus, the resonance frequency of the MEMS chip has been effectively improved and the SNR is simultaneously high.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:
1. A MEMS chip comprising:
   a capacitance system, including:
      a back plate;
      a membrane spaced apart from and opposite to the back plate;
   a substrate with a back cavity, supporting the capacitance system above the back cavity and located on one side of the membrane away from the back plate, including:
      a first surface opposite to the membrane;
      a second surface opposite to the first surface; and
      an inner wall connecting the first surface and the second surface and enclosing the back cavity, including: a first opening close to the membrane, having a first width along a first direction perpendicular with a vibration direction of the membrane, and a second opening away from the membrane, having a second width smaller than the first width along the first direction;
   a first support portion fixed on the substrate; and
   a second support portion fixed on one side of the membrane away from the first support portion; wherein
   the membrane is fixed on one side of the first support portion away from the substrate; the back plate is positioned above the membrane by support of the second support portion.

2. The MEMS chip as described in claim 1, wherein a projection of the inner wall along the vibration direction is trapezoid.

3. The MEMS chip as described in claim 1, wherein a plurality of through holes is provided on the back plate; the through holes penetrate the back plate along the vibration direction of the membrane.

4. The MEMS chip as described in claim 1, wherein the back plate comprises a lower surface facing the membrane and a protrusion protruding from the lower surface towards the membrane; the protrusion is spaced apart from the membrane along the vibration direction of the membrane.

* * * * *